(12) United States Patent
Oki et al.

(10) Patent No.: US 12,165,899 B2
(45) Date of Patent: Dec. 10, 2024

(54) BIPOLAR ELECTROSTATIC CHUCK FOR ETCH CHAMBER

(71) Applicant: Applied Materials, Inc., Santa Clara, CA (US)

(72) Inventors: Shinichi Oki, Chiba prefecture (JP); Yuji Aoki, Kanagawa prefecture (JP); Trishul Byregowda Shivalingaiah, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 244 days.

(21) Appl. No.: 17/962,410

(22) Filed: Oct. 7, 2022

(65) Prior Publication Data

US 2024/0120229 A1 Apr. 11, 2024

(51) Int. Cl.
*H01L 21/683* (2006.01)

(52) U.S. Cl.
CPC .............. *H01L 21/6833* (2013.01)

(58) Field of Classification Search
CPC .................................................. H01L 21/6833
See application file for complete search history.

(56) References Cited

U.S. PATENT DOCUMENTS

| 5,838,529 A | 11/1998 | Shufflebotham et al. |
| 6,462,928 B1 | 10/2002 | Shamouilian et al. |
| 9,793,149 B2 | 10/2017 | Song et al. |
| 2005/0047057 A1 | 3/2005 | Kwon |
| 2015/0331337 A1 | 11/2015 | Sundarrajan et al. |
| 2020/0185248 A1* | 6/2020 | Sarode Vishwanath ..... H01L 21/6833 |
| 2020/0266088 A1* | 8/2020 | Kosakai ............ H01L 21/76826 |
| 2020/0411357 A1* | 12/2020 | Kunita ................ H01L 21/6833 |
| 2021/0143046 A1* | 5/2021 | Hamada ............ H01L 21/68785 |
| 2021/0343512 A1 | 11/2021 | Parkhe et al. |

FOREIGN PATENT DOCUMENTS

JP 2011-009692 A 1/2011

OTHER PUBLICATIONS

International Search Report for PCT/US2023/034695, dated Jan. 26, 2024.

* cited by examiner

*Primary Examiner* — Scott Bauer
(74) *Attorney, Agent, or Firm* — MOSER TABOA

(57) ABSTRACT

Embodiments of bipolar electrostatic chucks are provided herein. In some embodiments, a bipolar electrostatic chuck includes a ceramic plate; a plurality of electrodes disposed in the ceramic plate, wherein the plurality of electrodes include one or more positive electrodes arranged in a first pattern and one or more negative electrodes arranged in a second pattern; an aluminum base plate coupled to the ceramic plate; a positive conduit extending through the aluminum base plate and electrically coupled to the one or more positive electrodes, and a negative conduit extending through the aluminum base plate and electrically coupled to the one or more negative electrodes; and a first insulative tube disposed about each of the positive conduit and the negative conduit.

20 Claims, 4 Drawing Sheets

BIPOLAR ELECTROSTATIC CHUCK FOR ETCH CHAMBER

FIELD

Embodiments of the present disclosure generally relate to substrate processing equipment.

BACKGROUND

Integrated circuits are made possible by processes which produce intricately patterned material layers on substrate surfaces. Producing patterned material on a substrate requires controlled methods for applying and removing material. For removal, chemical etching is used for a variety of purposes including transferring a pattern in photoresist into underlying layers, thinning layers, or thinning lateral dimensions of features already present on the surface. Having an etch process that etches one material faster than another may be desirable to facilitate, for example, a pattern transfer process. Such an etch process is said to be selective to the first material. As a result of the diversity of materials, circuits, and processes, etch processes have been developed with a selectivity towards a variety of materials. However, conventional monopolar electrostatic chucks cannot chuck dielectric substrates, such as sapphire wafers. Accordingly, the inventors have provided embodiments of improved bipolar electrostatic chucks that can chuck dielectric substrates.

SUMMARY

Embodiments of bipolar electrostatic chucks are provided herein. In some embodiments, a bipolar electrostatic chuck includes: a ceramic plate; a plurality of electrodes disposed in the ceramic plate, wherein the plurality of electrodes include one or more positive electrodes arranged in a first pattern and one or more negative electrodes arranged in a second pattern; an aluminum base plate coupled to the ceramic plate; a positive conduit extending through the aluminum base plate and electrically coupled to the one or more positive electrodes, and a negative conduit extending through the aluminum base plate and electrically coupled to the one or more negative electrodes; and a first insulative tube disposed about each of the positive conduit and the negative conduit.

In some embodiments, a substrate support includes: a ceramic plate having a plurality of electrodes disposed in the ceramic plate, wherein the plurality of electrodes include one or more positive electrodes arranged in a first pattern and one or more negative electrodes arranged in a second pattern; an aluminum base plate coupled to the ceramic plate; a positive conduit extending through the aluminum base plate and electrically coupled to the one or more positive electrodes, and a negative conduit extending through the aluminum base plate and electrically coupled to the one or more negative electrodes; a first insulative tube disposed about each of the positive conduit and the negative conduit; and an adapter plate coupled to the lower surface of the aluminum base plate, wherein the adapter plate extends radially outward beyond the aluminum base plate.

In some embodiments, a process chamber includes: a chamber body having an interior volume; a substrate supporting, comprising: a ceramic plate disposed in the interior volume, wherein the ceramic plate includes a plurality of electrodes disposed therein, wherein the plurality of electrodes include one or more positive electrodes arranged in a first pattern and one or more negative electrodes arranged in a second pattern; an aluminum base plate coupled to the ceramic plate; a positive conduit extending through the aluminum base plate and electrically coupled to the one or more positive electrodes, and a negative conduit extending through the aluminum base plate and electrically coupled to the one or more negative electrodes; and a first insulative tube disposed about each of the positive conduit and the negative conduit; and a pump coupled to the chamber body and configured to evacuate the interior volume.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
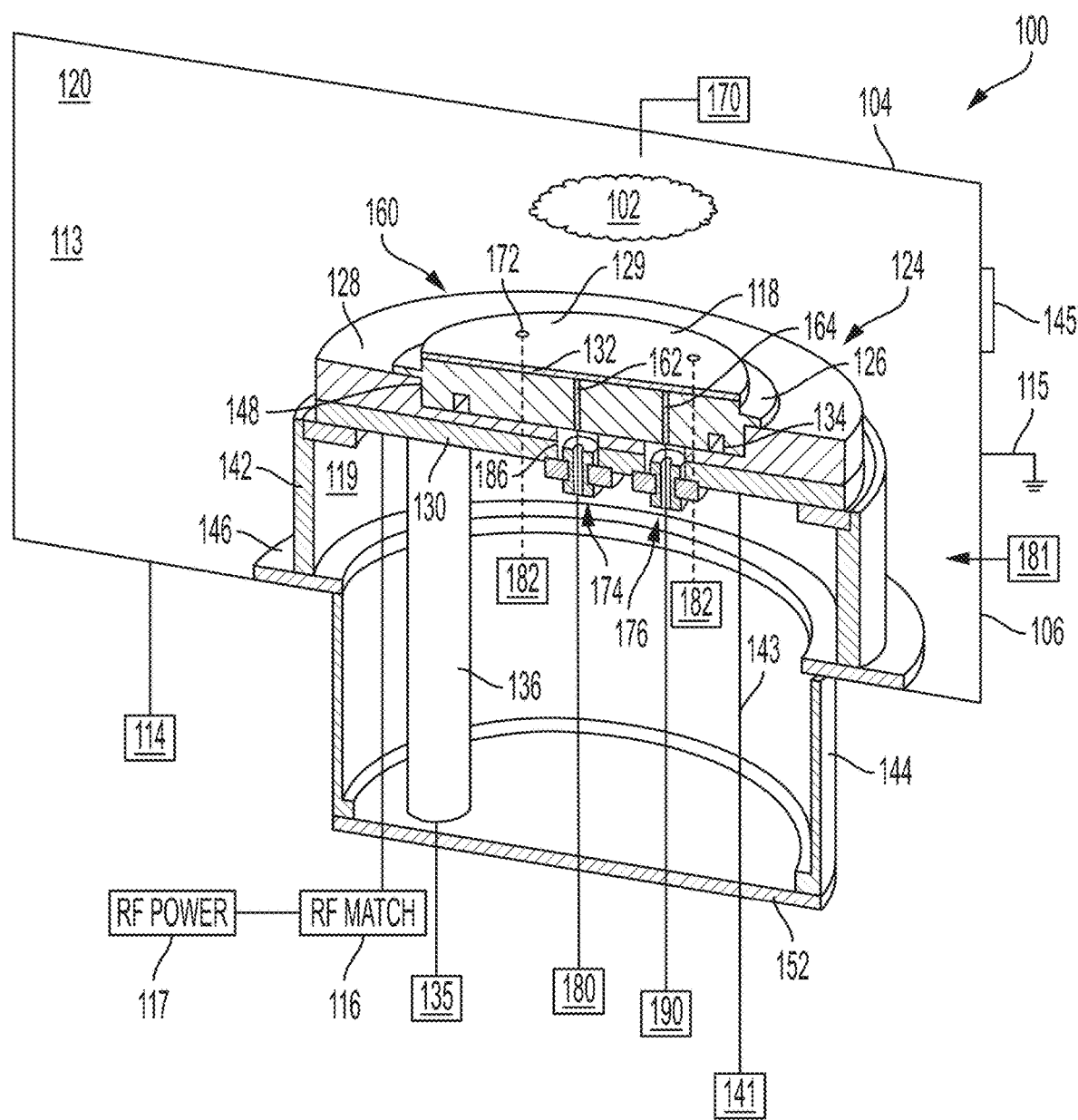
FIG. 1 depicts a schematic, isometric side view of a process chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of bipolar electrostatic chucks (ESC) are provided herein. The bipolar ESC generally contains two electrodes below a support surface of the bipolar ESC. The two electrodes are provided with a power source creating an electric field that causes charges to migrate along an underside of the substrate. The substrate and the electrodes accumulate oppositely polarized charges, clamping the substrate to the support surface. The two electrodes are advantageously arranged in a negative electrode pattern and positive electrode pattern to create a gradient force sufficient to clamp the substrate while spaced enough to avoid arcing between the electrodes.

FIG. 1 depicts a schematic side view of a process chamber in accordance with at least some embodiments of the present disclosure. In some embodiments, the process chamber 100 is an etch processing chamber. However, other types of processing chambers configured for different processes can also use or be modified for use with embodiments of the bipolar ESC described herein.

The process chamber 100 includes a chamber body 106 covered by a lid 104 which encloses an interior volume 120. The interior volume 120 may include an upper interior volume 113, or processing volume, and a lower interior volume 119. The process chamber 100 is generally a vacuum chamber which is suitably adapted to maintain sub-atmospheric pressures within the upper interior volume 113 during substrate processing. The chamber body 106 and lid 104 may be made of metal, such as aluminum. The chamber body 106 may be grounded via a coupling to ground 115.

A substrate support 124 is disposed within the interior volume 120 to support and retain a substrate (see substrate 210 in FIG. 2), such as a dielectric substrate (e.g., sapphire substrate). The substrate support 124 may generally include a bipolar ESC 160, an outer shell 142 coupled to the bipolar ESC 160, and a lower housing 144 coupled to the outer shell 142. The substrate support 124 may be coupled to the chamber body 106 via the outer shell 142. For example, the outer shell 142 may include a flange 146 that is coupled to the chamber body 106. The substrate support 124 may include a lower housing 144 coupled to the outer shell 142. In some embodiments, the lower housing 144 includes a bottom plate 152. The lower housing 144, the outer shell 142, and the bipolar ESC 160 define the lower interior volume 119. The bipolar ESC 160, as shown in FIG. 1, is a stationary support. However, in other examples, the bipolar ESC 160 may be vertically movable with respect to the chamber body 106.

The bipolar ESC 160 generally includes a ceramic plate 118 (described in more detail below) having a plurality of electrodes disposed therein (see FIGS. 2 and 5). The ceramic plate 118 is coupled to an aluminum base plate 126. In some embodiments, the ceramic plate 118 is bonded to the aluminum base plate 126. For example, an adhesive bonding layer 132 may facilitate bonding the ceramic plate 118 to the aluminum base plate 126. In some embodiments, the aluminum base plate 126 includes cooling channels 134 for cooling the bipolar ESC 160. A cooling conduit 136 is coupled to the cooling channels 134 to facilitate flowing a coolant, such as water, therethrough. The cooling conduit 136 may comprise a tube extending from the bottom plate 152 to a backside of the bipolar ESC 160.

In some embodiments, the bipolar ESC 160 includes an adapter plate 128 coupled to the aluminum base plate 126. In some embodiments, an upper surface of the adapter plate 128 includes a recess 148 and the aluminum base plate 126 is at least partially disposed in the recess 148. In some embodiments, an entire lowermost surface of the aluminum base plate is disposed in the recess 148. In some embodiments, the adapter plate 128 extends radially outward beyond the aluminum base plate 126. The adapter plate 128 may be made of a metal, such as aluminum.

In some embodiments, the bipolar ESC 160 includes a facility plate 130 coupled to the adapter plate 128. The facility plate 130 is configured to facilitate providing, for example, backside gases, process gases, fluids, coolants, power, or the like, to the bipolar ESC 160. For example, the bipolar ESC 160 may be coupled a backside gas supply 141, a chucking power supply 140, and RF sources (e.g., bias power supply 117) via the facility plate 130. In some embodiments, the bias power supply 117 includes one or more RF bias power sources. In some embodiments, RF energy is supplied by a RF plasma power supply 170. In some embodiments, the RF plasma power supply 170 may have a frequency of about 400 kHz to over 40 MHz. In some embodiments, a RF plasma power supply 170 and a bias power supply 117 are coupled to the bipolar ESC 160 via respective RF match networks (only RF match network 116 shown). In some embodiments, the AC, DC, or RF power may be pulsed. In some embodiments, the facility plate 130 has an outer sidewall coplanar with an outer sidewall the adapter plate 128.

The bipolar ESC 160 includes a positive conduit 162 extending through the aluminum base plate 126 and electrically coupled to the one or more positive electrodes in the ceramic plate 118. The positive conduit 162 is coupled to a bipolar voltage power supply 180. The bipolar voltage power supply 180 is configured to deliver power with a positive polarity. The bipolar ESC 160 includes a negative conduit 164 extending through the aluminum base plate 126 and electrically coupled to the one or more negative electrodes in the ceramic plate 118. The negative conduit 164 is coupled to a bipolar voltage power supply 190 configured to provide power with a negative polarity. In some embodiments, the bipolar voltage power supply 180 and the bipolar voltage power supply 190 are configured to deliver about 4500 to about 5500 volts. In some embodiments, the bipolar voltage power supply 180 may be a single power supply configured to provide power with a positive polarity to the positive conduit 162 and power with a negative polarity to the negative conduit 164.

In some embodiments, a positive voltage terminal 174 is coupled to the positive conduit 162. The positive voltage terminal 174 may be disposed proximate a center of the adapter plate 128. In some embodiments, a negative voltage terminal 176 is coupled to the negative conduit 164 and disposed radially outward of the positive voltage terminal 174. In some embodiments, the adapter plate 128 and the facility plate 130 include openings for the positive voltage terminal 174 and the negative voltage terminal 176.

In some embodiments, the bipolar ESC 160 includes a plurality of lift pin openings 172 extending through the aluminum base plate 126 and the ceramic plate 118. In some embodiments, a plurality of lift pin assemblies 182 are coupled to the bipolar ESC 160 and configured to selectively raise or lower a plurality of lift pins with respect to an upper surface 129 of the ceramic plate 118. In some embodiments, the plurality of lift pin assemblies 182 comprise actuators coupled to the plurality of lift pins. In some embodiments, the plurality of lift pin openings 172 consists of 4 lift pin openings.

In some embodiments, a backside gas feedthrough 143 is coupled to the adapter plate 128. The backside gas feedthrough 143 is fluidly coupled to the upper surface 129 of the ceramic plate 118. In some embodiments, the bipolar ESC 160 includes gas distribution channels extending from a lower surface of the bipolar ESC 160 (e.g., bottom surface of the facility plate 130) to various openings in the upper surface 129 of the bipolar ESC 160. The gas distribution channels are configured to provide backside gas, such as nitrogen (N) or helium (He), to the upper surface 129 to act as a heat transfer medium. The gas distribution channels are in fluid communication with the backside gas supply 141 via backside gas feedthrough 143 to control the temperature and/or temperature profile of the bipolar ESC 160 during use.

The process chamber 100 is coupled to and in fluid communication with a vacuum system 114 which includes a throttle valve and a pump which are used to exhaust the process chamber 100. The pressure in the interior volume 120, for example, the upper interior volume 113 may be regulated by adjusting the throttle valve and/or vacuum pump. The process chamber 100 is also coupled to and in fluid communication with a process gas supply 181 which may supply one or more process gases to the process chamber 100 for processing a substrate disposed therein. The process chamber 100 includes a slit valve 145 to facilitate transferring the substrate 210 into and out of the interior volume 120. In some embodiments, a transfer robot (not shown) is configured to transfer the substrate 210. The slit valve 145 may be coupled to the lid 104 or chamber body 106.

In operation, for example, a plasma 102 may be created in the interior volume 120 to perform one or more processes. The plasma 102 may be created by coupling power from a plasma power source (e.g., a RF plasma power supply 170) to a process gas via one or more chucking electrodes near or within the upper interior volume 113 to ignite the process gas and creating the plasma 102. A bias power may be provided from a bias power supply (e.g., a bias power supply 117) to the substrate support 124 to attract ions from the plasma 102 towards the substrate 122.

Figure 2:
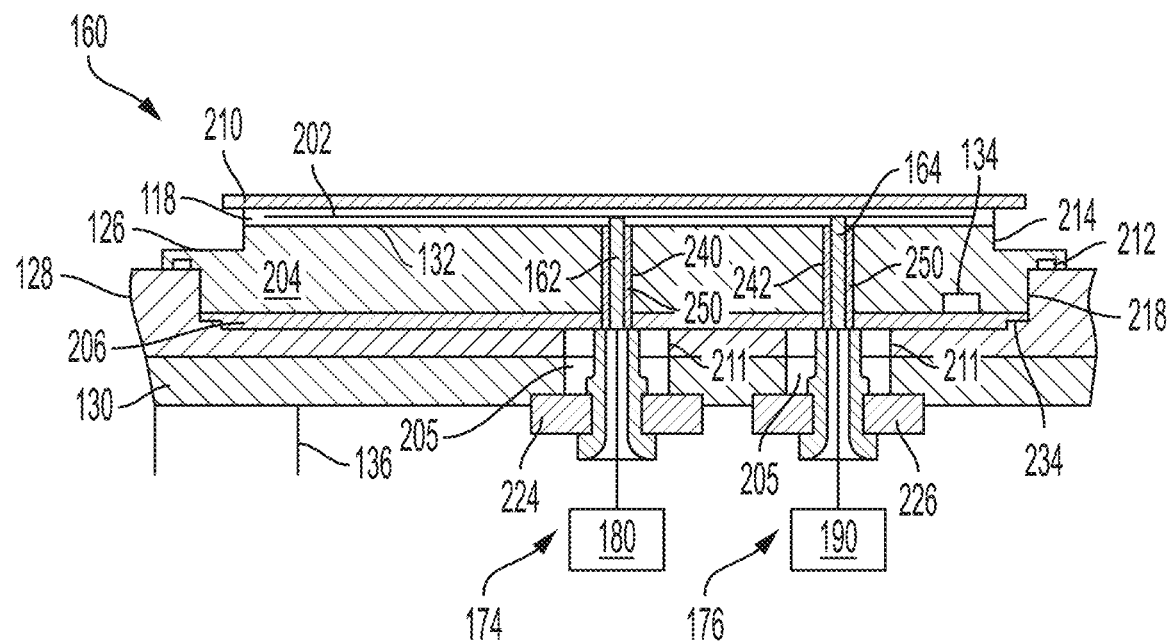
FIG. 2 depicts a cross-sectional side view of a bipolar electrostatic chuck in accordance with at least some embodiments of the present disclosure.

FIG. 2 depicts a cross-sectional side view of a bipolar ESC in accordance with at least some embodiments of the present disclosure. The bipolar ESC 160 includes a plurality of electrodes 202 disposed therein for clamping a substrate 210 disposed thereon. In some embodiments, the substrate 210 may extends radially beyond an outer sidewall of the ceramic plate 118. The plurality of electrodes 202 include one or more positive electrodes coupled to the positive conduit 162 and one or more negative electrodes coupled to the negative conduit 164. In some embodiments, the positive conduit 162 is disposed in a first opening 240 through the aluminum base plate 126. In some embodiments, the negative conduit 164 is disposed in a second opening 242 through the aluminum base plate 126.

In some embodiments, the aluminum base plate 126 includes a first plate 204 coupled to a second plate 206. The cooling channels 134 may be disposed in one of the first plate 204 and the second plate 206 while the other of the first plate 204 and the second plate 206 covers the cooling channels 134 when the first plate 204 and the second plate 206 are coupled. In some embodiments, the first plate 204 includes an upper peripheral notch 214. In some embodiments, the first plate includes a lower peripheral notch 218. In some embodiments, an o-ring 212 is disposed between the first plate 204 and the adapter plate 128 to provide a seal therebetween. In some embodiments, a sidewall formed by the upper peripheral notch 214 is disposed radially inward of a sidewall formed by the lower peripheral notch 218. In some embodiments, the second plate 206 includes a lower peripheral notch 234.

In some embodiments, a first insulative tube 250 is disposed about each of the positive conduit 162 and the negative conduit 164 to prevent arcing. In some embodiments, the positive voltage terminal 174 is coupled to the bipolar ESC 160 via a retaining ring 224. In some embodiments, the negative voltage terminal 176 is coupled to the bipolar ESC 160 via a second retaining ring 226. In some embodiments, the retaining ring 224 and the second retaining ring 226 are partially disposed in the facility plate 130. In some embodiments, the facility plate 130 includes openings 205 for accommodating the positive voltage terminal 174 and the negative voltage terminal 176. In some embodiments, the adapter plate 128 includes openings 211 aligned with the openings 205 for accommodating the positive voltage terminal 174 and the negative voltage terminal 176.

Figure 3:
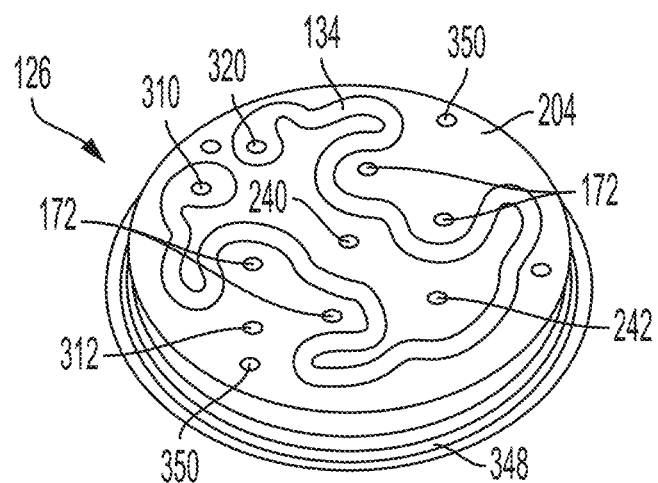
FIG. 3 depicts an isometric bottom view of an aluminum base plate in accordance with at least some embodiments of the present disclosure.

FIG. 3 depicts an isometric bottom view of a first plate of an aluminum base plate 126 in accordance with at least some embodiments of the present disclosure. The cooling channel 134 generally includes a fluid inlet 310 and a fluid outlet 320 for circulating a coolant through the cooling channel 134. In some embodiments, the cooling channel 134 is disposed about, or around, the first opening 240 and the second opening 242. In some embodiments, the aluminum base plate 126 includes a gas distribution channel 312 that extends from a single inlet at the bottom of the first plate 204 to a plurality of outlets on a top surface of the first plate 204. In some embodiments, the first plate 204 includes fastener openings 350 for coupling the first plate 204 to other plates of the bipolar ESC, for example, the adapter plate 128. In some embodiments, the first plate 204 includes an annular channel 348 for housing the o-ring 212.

Figure 4:
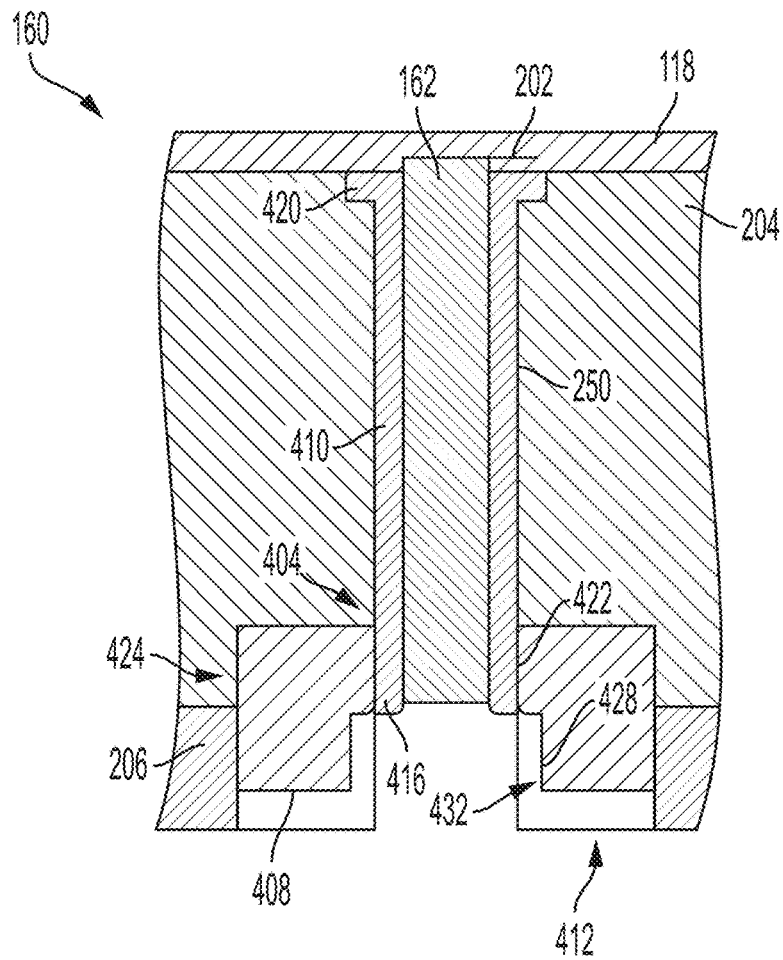
FIG. 4 depicts a partial cross-sectional side view of a bipolar electrostatic chuck in accordance with at least some embodiments of the present disclosure.

FIG. 4 depicts a partial cross-sectional view of an electrostatic chuck in accordance with at least some embodiments of the present disclosure. In some embodiments, the positive conduit 162 is a rod-shaped member made of a conductive material. In some embodiments, the positive conduit 162 has a diameter of about 0.1 to about 0.4 inches. The negative conduit 164 may be similar in shape and size as the positive conduit 162. In some embodiments, the first insulative tube 250 includes a hollow cylindrical body 410 and an upper flange 420 extending outward from the hollow cylindrical body 410. In some embodiments, the first insulative tube 250 includes a beveled lower inner end 416. In some embodiments, the first insulative tube 250 extends slightly beyond the positive conduit 162 on a side of the positive conduit 162 opposite the ceramic plate 118.

In some embodiments, the bipolar ESC 160 advantageously includes a second insulative tube 408 disposed about each first insulative tube 250 to reduce or prevent arcing due to high voltage power delivered to the positive conduit 162. In some embodiments, the second insulative tube 408 is disposed about a lower portion 404 of the hollow cylindrical body 410 and adjacent a lower end 412 of the aluminum base plate. In some embodiments, the second insulative tube 408 has an L shaped cross-sectional shape. For example, the second insulative tube 408 has a first inner diameter 422 proximate an upper end 424 and a second inner diameter 428 proximate a lower end 432. The first inner diameter 422 is smaller than the second inner diameter 428. In some embodiments, the second inner diameter 428 is about 0.4 to about 0.6 inches. In some embodiments, the first inner diameter 422 is about 0.3 to about 0.4 inches.

Figure 5:
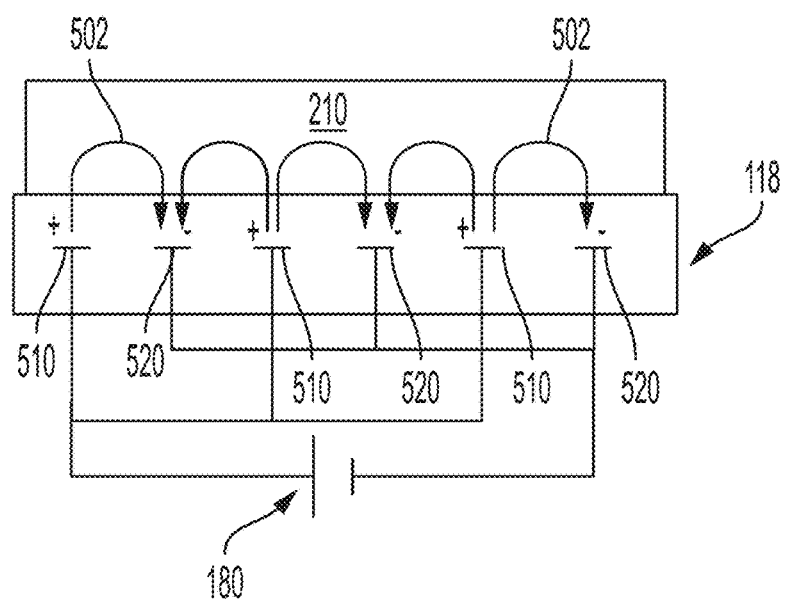
FIG. 5 depicts a schematic cross-sectional side view of a bipolar electrostatic chuck in accordance with at least some embodiments of the present disclosure.

FIG. 5 depicts a schematic cross-sectional view of a bipolar ESC 160 in accordance with at least some embodiments of the present disclosure. FIG. 5 depicts one or more positive electrodes 510 of the plurality of electrodes 202 and one or more negative electrodes 520 of the plurality of electrodes 202. The one or more positive electrodes 510 and the plurality of negative electrodes 520 have a gap therebetween, such that a gradient force 502 is generated when the bipolar voltage power supply 180 provides positive polarity voltage to the one or more positive electrodes 510 and negative polarity voltage to the one or more negative electrodes 520. The gradient force 502 clamps the substrate 210 to the ceramic plate 118.

Figure 6:
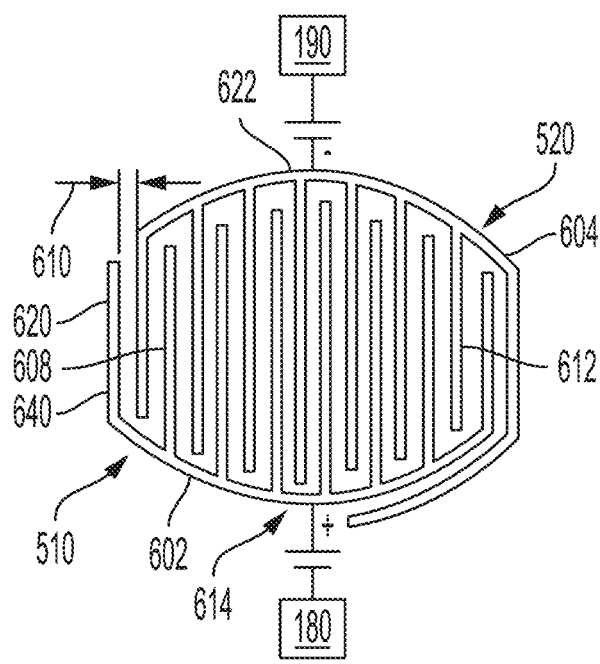
FIG. 6 depicts a schematic top view of a bipolar electrostatic chuck in accordance with at least some embodiments of the present disclosure.

FIG. 6 depicts a schematic top view of an electrostatic chuck in accordance with at least some embodiments of the present disclosure. In some embodiments, the plurality of electrodes 202 include one or more positive electrodes 510 arranged in a first pattern 602 and one or more negative electrodes 520 arranged in a second pattern 604. In some embodiments, the one or more positive electrodes 510 comprise a single interconnected positive electrode to form the first pattern 602. In some embodiments, the one or more negative electrodes 520 comprise a single interconnected negative electrode to form the second pattern 604. In some embodiments, the one or more negative electrodes 520 comprise a plurality of separate interconnected negative electrodes that are coupled to the bipolar voltage power supply 190. In some embodiments, the first pattern 602 comprises a plurality of radially extending electrodes 608 and wherein the second pattern 604 comprises a plurality of second radially extending electrodes 612.

In some embodiments, the first pattern 602 and the second pattern 604 are arranged such that a gap 610 between each of the one or more positive electrodes and each of the one or more negative electrodes is about 0.9 mm to about 1.6 mm. In some embodiments, the first pattern 602 is different than the second pattern 604. In some embodiments, the gap 610 is maintained throughout the ceramic plate 118. In some embodiments, as depicted in FIG. 6, the one or more positive electrodes 510 and the one or more negative electrodes 520 are arranged along a common horizontal plane. In some embodiments, the first pattern 602 and the second pattern 604 are intertwined. In some embodiments, the first pattern 602 comprises curved portions 614 and linear portions 620. In some embodiments, the second pattern 604 comprises curved portions 622 and linear portions 640.

While the foregoing is directed to embodiments of the present disclosure, other and further embodiments of the disclosure may be devised without departing from the basic scope thereof.

The invention claimed is:

1. A bipolar electrostatic chuck, comprising:
   a ceramic plate;
   a plurality of electrodes disposed in the ceramic plate, wherein the plurality of electrodes include one or more positive electrodes arranged in a first pattern and one or more negative electrodes arranged in a second pattern;
   an aluminum base plate coupled to the ceramic plate;
   a positive conduit extending through the aluminum base plate and electrically coupled to the one or more positive electrodes, and a negative conduit extending through the aluminum base plate and electrically coupled to the one or more negative electrodes; and
   a first insulative tube disposed about the positive conduit or the negative conduit; and
   a second insulative tube disposed about the first insulative tube adjacent a lower end of the aluminum base plate.

2. The bipolar electrostatic chuck of claim 1, wherein a gap between each of the one or more positive electrodes and each of the one or more negative electrodes is about 0.9 mm to about 1.6 mm.

3. The bipolar electrostatic chuck of claim 1, wherein the bipolar electrostatic chuck includes a plurality of lift pin openings extending through the aluminum base plate and the ceramic plate.

4. The bipolar electrostatic chuck of claim 1, wherein the second insulative tube has a first inner diameter proximate an upper end and a second inner diameter proximate a lower end, wherein the first inner diameter is different than the second inner diameter.

5. The bipolar electrostatic chuck of claim 1, wherein the aluminum base plate includes a cooling channel disposed therein.

6. The bipolar electrostatic chuck of claim 1, wherein the first pattern comprises curved portions and linear portions, and wherein the second pattern comprises curved portions and linear portions.

7. The bipolar electrostatic chuck of claim 1, wherein the first pattern and the second pattern are intertwined.

8. The bipolar electrostatic chuck of claim 1, wherein one or more positive electrodes and the one or more negative electrodes are arranged along a common horizontal plane.

9. The bipolar electrostatic chuck of claim 1, wherein the first pattern is different than the second pattern.

10. A substrate support, comprising:
    a ceramic plate having a plurality of electrodes disposed in the ceramic plate, wherein the plurality of electrodes include one or more positive electrodes arranged in a first pattern and one or more negative electrodes arranged in a second pattern;
    an aluminum base plate coupled to the ceramic plate;
    a positive conduit extending through the aluminum base plate and electrically coupled to the one or more positive electrodes, and a negative conduit extending through the aluminum base plate and electrically coupled to the one or more negative electrodes;
    a first insulative tube disposed about the positive conduit or the negative conduit;
    a second insulative tube disposed about the first insulative tube adjacent a lower end of the aluminum base plate; and
    an adapter plate coupled to a lower surface of the aluminum base plate, wherein the adapter plate extends radially outward beyond the aluminum base plate.

11. The substrate support of claim 10, wherein the one or more positive electrodes comprise a single interconnected positive electrode to form the first pattern.

12. The substrate support of claim 10, wherein the adapter plate is coupled to a positive voltage terminal proximate a center of the adapter plate and is coupled to a negative voltage terminal disposed radially outward of the positive voltage terminal.

13. The substrate support of claim 10, wherein the first pattern comprises a plurality of radially extending electrodes and wherein the second pattern comprises a plurality of second radially extending electrodes.

14. The substrate support of claim 10, further comprising a backside gas feedthrough coupled to the adapter plate, wherein the backside gas feedthrough is fluidly coupled to an upper surface of the ceramic plate.

15. The substrate support of claim 10, wherein the aluminum base plate is bonded to the ceramic plate.

16. A process chamber, comprising:
    a chamber body having an interior volume;
    a substrate supporting disposed in the interior volume and comprising:
      a ceramic plate disposed in the interior volume, wherein the ceramic plate includes a plurality of electrodes disposed therein, wherein the plurality of electrodes include one or more positive electrodes arranged in a first pattern and one or more negative electrodes arranged in a second pattern;
      an aluminum base plate coupled to the ceramic plate;
      a positive conduit extending through the aluminum base plate and electrically coupled to the one or more positive electrodes, and a negative conduit extending through the aluminum base plate and electrically coupled to the one or more negative electrodes; and
      a first insulative tube disposed about each of the positive conduit or the negative conduit;
      a second insulative tube disposed about the first insulative tube adjacent a lower end of the aluminum base plate; and
    a pump coupled to the chamber body and configured to pump down the interior volume.

17. The process chamber of claim 16, wherein the one or more positive electrodes and the one or more negative electrodes are coupled to a bipolar voltage power supply configured to deliver about 4500 to about 5500 volts.

18. The process chamber of claim 16, and wherein a gap between each of the one or more positive electrodes and each of the one or more negative electrodes is about 0.9 mm to about 1.6 mm.

19. The process chamber of claim 16, wherein the aluminum base plate includes cooling channels and further comprising a cooling conduit coupled to the cooling channels to facilitate flowing a coolant therethrough.

20. The process chamber of claim 16, further comprising a plurality of lift pin assemblies coupled to the aluminum base plate configured to selectively raise or lower a plurality of lift pins with respect to an upper surface of the ceramic plate.

\* \* \* \* \*